United States Patent [19]

Chung

[11] Patent Number: 5,423,015

[45] Date of Patent: Jun. 6, 1995

[54] MEMORY STRUCTURE AND METHOD FOR SHUFFLING A STACK OF DATA UTILIZING BUFFER MEMORY LOCATIONS

[76] Inventor: David S. F. Chung, 58 Edgecliff Esplanade, Seaforth, N.S.W. 2092, Australia

[21] Appl. No.: 700,132

[22] PCT Filed: Oct. 20, 1989

[86] PCT No.: PCT/AU89/00460

§ 371 Date: May 21, 1991

§ 102(e) Date: May 21, 1991

[87] PCT Pub. No.: WO90/04849

PCT Pub. Date: May 3, 1990

[30] Foreign Application Priority Data

Oct. 20, 1988 [AU] Australia ............... PJ1065
Apr. 21, 1989 [AU] Australia ............... PJ3848

[51] Int. Cl.$^6$ ............................................. G06F 13/00
[52] U.S. Cl. ................................... 395/425; 395/600; 364/DIG. 1
[58] Field of Search .............. 395/425, 250, 600, 800; 365/189.12, 78, 221, 49

[56] References Cited

U.S. PATENT DOCUMENTS

| | | | |
|---|---|---|---|
| 3,713,107 | 1/1973 | Barsamian | 395/800 |
| 4,030,077 | 6/1977 | Florence et al. | 395/800 |
| 4,031,520 | 6/1977 | Rohner | 395/800 |
| 4,110,837 | 8/1978 | Chen | 395/800 |
| 4,663,742 | 5/1987 | Anderson et al. | 365/49 |
| 4,740,917 | 4/1988 | Denis et al. | 365/49 |
| 4,758,982 | 7/1988 | Price | 365/49 |
| 4,758,983 | 7/1988 | Berndt | 365/49 |
| 4,811,305 | 3/1989 | Watanabe et al. | 365/239 |
| 4,833,655 | 5/1989 | Wolf et al. | 365/221 |
| 4,839,866 | 6/1989 | Ward et al. | 365/221 |
| 4,847,812 | 7/1989 | Lodhi | 365/221 |
| 4,864,544 | 9/1989 | Spak et al. | 365/189.12 |

OTHER PUBLICATIONS

Weller et al, "Optimal Searching Algorithms for Parallel Pipelined Computers", Proceedings of the Sagamore Computer Conference, Aug. 20–23, 1974 (Springer Verlag, New York, 1975), pp. 291–305.

Segal, "Hardware Sorting Chip Steps Up Software Pace", Electronic Design, vol. 34, No. 15, Jun. 26, 1986, pp. 85–91.

Baudet et al., "Supercomputing With VLSI: Sorting", 1987 IEEE International Conference on Computer Design: VLSI In Computers & Processing, Oct. 8, 1987, pp. 8–11.

Primary Examiner—Glenn Gossage
Attorney, Agent, or Firm—Fitch, Even, Tabin & Flannery

[57] ABSTRACT

A memory structure which can operate as a stack or list, the structure comprising a plurality of contiguous memory locations sub-divided into contiguous sub-structures, each of the sub-structures having at least one buffer memory location associated with it, whereby stack or list shuffle operations can be performed in parallel on the sub-structures. The memory structure can be utilized in a content addressable memory and records can be maintained in sorted order by key in the memory structure. The content addressable memory can be implemented using currently available random access memory (RAM) structures and the content addressable memory can be implemented in very large scale integration (VLSI).

23 Claims, 8 Drawing Sheets

MEMORY STRUCTURE AND METHOD FOR SHUFFLING A STACK OF DATA UTILIZING BUFFER MEMORY LOCATIONS The present invention relates to a memory structure and, in particular, to a memory structure which is adapted to permit relatively fast shuffling of data stored in the structure through the structure thereby commercially facilitating operations such as sorting.

DISCUSSION OF PRIOR ART

A particular, although by no means exhaustive, use for the memory structure outlined in this specification is in the field of content addressable memories (CAMs).

In the late 1970's it was realized that the majority of the work that computers were being called upon to perform in the majority of applications was associative in nature, including sorting information, accessing information by key and the like. It was also realized that the storing of information according to a memory address in a memory (e.g. random access memory (RAM) and the like) was not the most efficient way of storing that information where associative type operations were to be performed on that information. Ideally it was preferred that the information be stored according to specific search keys, and clustered in accordance with an algorithm which related the search keys, in some way (for example alphabetical order, numerical order or the like).

Storing information in memory according to the content of the information being stored (ie. according to a key which is itself part of the stored information) rather than storing according to an address became known as content addressable memory (CAM). Software tree structures were and still are a software implementation of a content addressable memory. In essentially all cases to date, the memory in which the elements of that tree structure reside is still conventional random access memory with elements of the tree stored by address. Ideally a hardware content addressable memory structure should be much faster than a hardware RAM combined with a software tree structure. Various attempts have been made to date to make normally addressable RAM behave as content addressable memory thereby combining the inexpensiveness and large memory capacity of commercially available RAM, with the desired CAM structure. U.S. Pat. No. 4,758,982 to PRICE discloses one such attempt and also provides a good summary of CAM issues. U.S. Pat. No. 4,758,983 to BERNDT discloses another attempt at making commercially available RAM behave as a CAM.

SUMMARY OF THE INVENTION

In at least one particular embodiment of the present invention, commercially available RAM is combined with surrounding hardware logic so as to provide a (relatively) very fast CAM structure.

In other embodiments of the invention a memory stack structure which can be shuffled very rapidly, in an arbitrarily and user selectable small number of CPU cycles is disclosed. This structure seeks to go at least some way in overcoming a commonly held belief in the industry that maintaining data in sorted list order is computationally highly inefficient (even though desirable).

In one broad form there is provided a memory structure for storing records. The structure comprises a plurality of contiguous memory locations each for storing one of the records, the plurality of memory locations being functionally separated into memory sub-structures, each of the memory sub-structures comprising a separate but contiguous sub-portion of the memory structure, each of the sub-structures including a buffer memory location attached thereto, each of the buffer memory locations being arranged to receive a record stored in a memory location within the associated sub-structure and to transfer a record stored in the buffer memory location to a memory location within another of the sub-structures, each of the buffer memory locations being further arranged to receive a record stored in a memory location in a sub-structure which is immediately adjacent to the sub-structure corresponding with the buffer memory and to transfer a record stored in the buffer memory location to a memory location in a sub-structure which is immediately adjacent the sub-structure located with the buffer memory location.

As used in this specification the term "contiguous" implies a structure which is ordered in a logical sense, but not necessarily a physical sense. The term probably best implies a separate but logical continuation (of memory structure) for the purposes of maintaining segmented but ordered data.

Similarly where memory locations are referred to as being above or below other memory locations, such descriptions are not to be taken literally, but rather should be read in a logical sense. In a particular embodiment of the invention, the arrangement of memory locations may be transposed sideways, which relates to transferring records across sub-structures, rather than up and down.

Preferably the memory structure is adapted to store the records in search key order; each of the records including a search key comprising at least a part of the record.

Preferably the memory structure performs as a stack or list, and a record is added to the stack or list at a chosen memory location within the memory structure by either shuffling all records at and above the chosen memory location up one memory location (UP SHUFFLE OPERATION) or shuffling all records at and below the chosen memory location down one memory location (DOWN SHUFFLE OPERATION) in the memory structure or by shuffling all records sideways in raster format when the sub-structures are transposed, and whereby a record is deleted from the stack or list by a logically opposite overwrite process.

In a further broad form there is provided a method of storing records in search key order in a memory structure, the memory structure comprising a plurality of contiguous memory locations wherein each memory location of the plurality of locations is adapted to store one of the records, the plurality of memory locations being functionally separated into memory sub-structures, each of the memory sub-structures comprising a separate but contiguous sub-portion of the memory structure, each sub-structure additionally including a buffer memory location attached to it, each buffer memory location adapted to receive a record stored in a memory location within the sub-structure or to transfer a record stored in the buffer memory location to a memory location within the sub-structure, the buffer memory location further adapted to receive a record stored in a memory location in a sub-structure which is immediately adjacent the sub-structure to which the buffer memory is attached or to transfer a record stored in the buffer memory location to a memory location in a sub-structure which is immediately adjacent the sub-structure to which the buffer memory is attached, the method comprising the steps of placing the records into contiguous memory locations in the structure ordered by search key.

In yet a further broad form there is provided a content addressable memory structure for storing records, the structure comprising a plurality of contiguous memory locations wherein each memory location of the plurality of locations is adapted to store one of the records, the plurality of memory locations being functionally separated into memory sub-structures, each of the memory sub-structures comprising a separate but contiguous sub-portion or the memory structure, each sub-structure additionally including a buffer memory location attached to it, each buffer memory location adapted to receive a record stored in a memory location within the sub-structure or to transfer a record stored in the buffer memory location to a memory location within the sub-structure, the buffer memory location being further adapted to receive a record stored in a memory location in a sub-structure which is immediately adjacent the sub-structure to which the buffer memory is attached or to transfer a record stored in the buffer memory location to a memory location in a sub-structure which is immediately adjacent the sub-structure to which the buffer memory is attached, the records maintained in the memory locations of the memory structure in sorted order by key.

In yet a further broad form there is provided a method of operating a memory structure so as to behave as a content addressable memory, a memory structure for storing records, the structure comprising a plurality of contiguous memory locations wherein each memory location of the plurality of locations is adapted to store one of the records, the plurality of memory locations being functionally separated into memory sub-structures, each of the memory sub-structures comprising a separate but contiguous sub-portion of the memory structure, each sub-structure additionally including a buffer memory location attached to it, each the buffer memory location adapted to receive a record stored in a memory location within the sub-structure or to transfer a record stored in the buffer memory location to a memory location within the sub-structure, the buffer memory location being further adapted to receive a record stored in a memory location in a sub-structure which is immediately adjacent the sub-structure to which the buffer memory is attached or to transfer a record stored in the buffer memory location to a memory location in a sub-structure which is immediately adjacent the sub-structure to which the buffer memory is attached, the method comprising maintaining the records in the memory locations of the memory structure in sorted order by key.

BRIEF DESCRIPTION OF THE DRAWINGS

Embodiments of the invention will now be described with reference to the drawings wherein.

DETAILED DESCRIPTION OF PREFERRED EMBODIMENTS

The following detailed description of the drawings relates to the embodiments of the invention implemented specifically as content addressable memory structure. However, the description of the preferred embodiments should not be taken as limiting the uses to which the broadest form of the invention as claimed can be put in practice.

1. BASIC "SHUFFLE" STRUCTURE EMBODIMENTS

Figure 1:
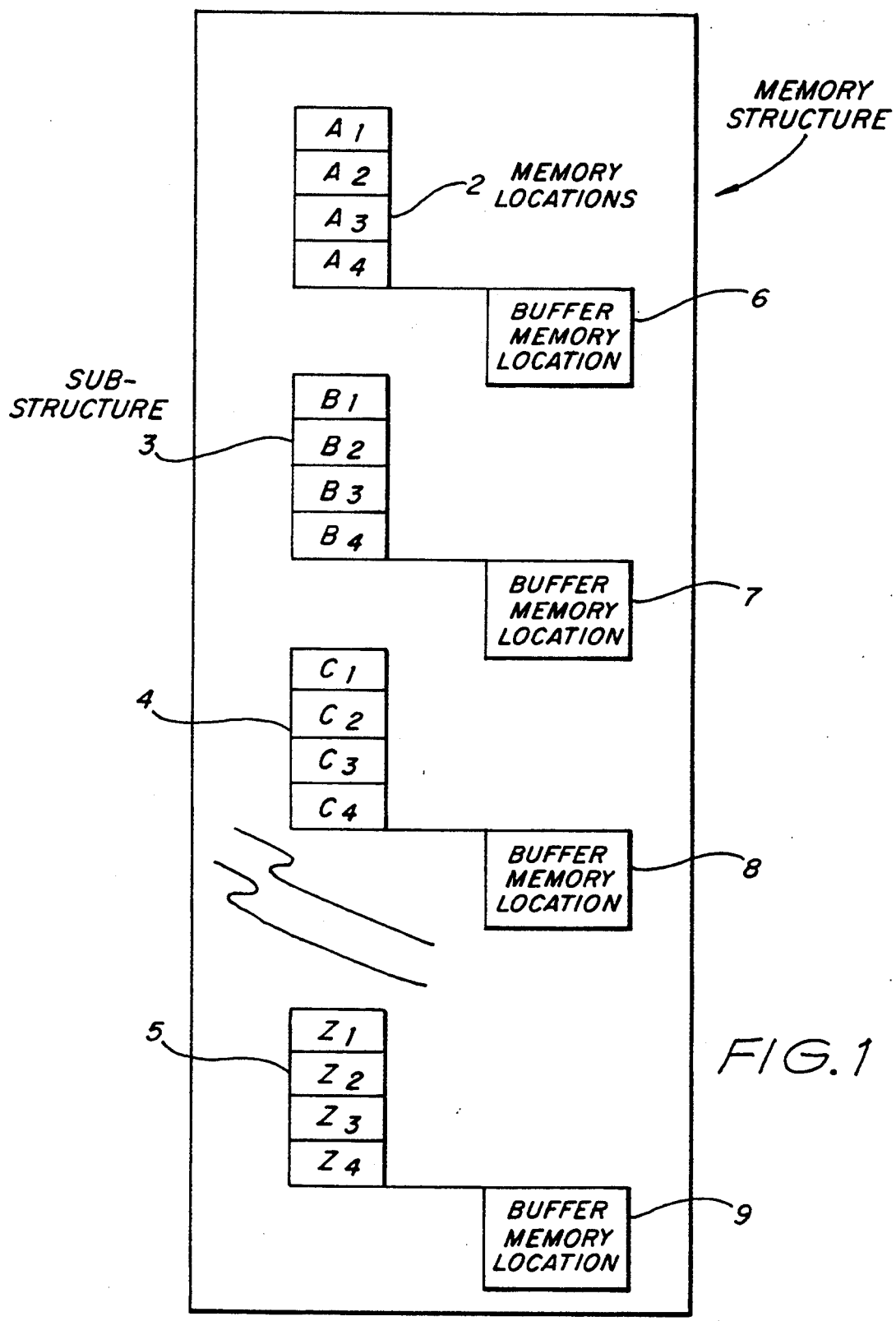
FIG. 1 shows a generalized embodiment of the memory structure of the present invention.
Figure 2:
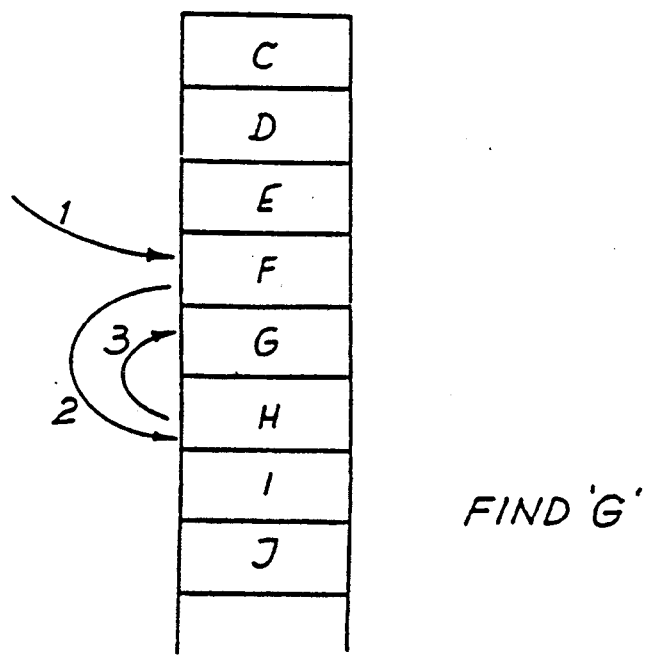
FIG. 2 shows a "FIND" operation using a binary search on a list (stack) of items.

The broadest form of the invention relates to a particular memory structure concept. That concept is illustrated diagrammatically in FIG. 1. It should be emphasized at the start that FIG. 1 is conceptual and does not necessarily bear any direct physical relation to real life implementations of the memory structure of the invention. With computers and computer memory, it is not so much the actual physical location of memory locations relative to each other that is important, but rather the data path connections between the memory locations.

Referring to FIG. 1 the memory structure 1 of a first embodiment of the invention is shown to comprise a plurality of memory locations A1, A2, A3, A4, B1, B2, B3, B4, C1, C2, C3, C4, and so on down to Z1, Z2, Z3, Z4. These memory locations are contiguous (ie. they are linked together in the order stated and for data in memory location A4, for example, to reach memory location A2, the data must be processed through memory location A3). The memory locations A1 through to 24 can therefore be thought of, notionally, as comprising a stack or list. In addition the memory locations are divided into sub-groupings of memory locations termed sub-structures 2, 3, 4, 5 (the sub-structures for memory locations D1 to Y4 are not shown but follow according to the concept already provided by FIG. 1 ). The sub-structures 2, 3, 4, 5 are ordered according to, and in, the same way as the memory locations so that they can be sub-grouped. ie. Sub-structure 2 containing memory locations A1 to A4 is "above" sub-structure 3 containing memory locations B1 through to B4 and, similarly, sub-structure 4 is "below" sub-structure 3. Similarly, within sub-structure 2 memory location A1 is above memory location A2 while memory location 4 is "below" memory location A3.

In addition to the ordered memory structure described in FIG. 1 there is also attached to each sub-structure 2, 3, 4, 5, a buffer memory location 6, 7, 8, 9 respectively. These buffer memory locations are not intended for normal storage of information in memory, but rather, exist for the purpose of holding what amounts to "overflow" data arising as a result of shuffling of data up or down the memory locations in each sub-structure 2, 3, 4, 5. The buffer memory locations allow memory shuffle in all sub-structures 2, 3, 4, 5 together (ie. in parallel).

To take one example applied to FIG. 1, (later used in a content addressable memory embodiment termed "split push-pull") if one assumes that it takes four clock cycles to shift the contents of memory locations A1 through to A4 down by one location (ie. the contents of A4 fall from [or are initially pushed from] the bottom of sub-structure 2 into the buffer memory location 6, the contents of A3 move to A4, the contents of A2 move to A3 and the contents of A1 move to A2) then in those same four clock cycles the memory contents of sub-structures of 3, 4 and 5 are also shifted downward by one memory location. To complete the downward shuffle movement, in the next few clock cycles the contents of buffer memory location 6 are transferred to memory location B1 at the top of sub-structure 2, the contents of buffer location 7 are transferred to memory location C1 in sub-structure 4 and so one (in parallel) for all of the sub-structures comprising the memory structure 1. Essentially, therefore, a downward memory shuffle is comprised of two steps: a first step (possibly commencing with an initial push of the lowermost memory location contents of each substructure into the buffer memory location of that sub-structure) where the memory contents in each sub-structure are shifted downward (all sub-structures carrying out this function at the same time, in parallel) followed by the transfer of the overflow from the first operation (now residing in the buffer memory locations) being transferred (again in a parallel operation) to the appropriate memory location in the adjacent sub-structure.

An up shuffle can be carried out in the same way with the contents of each of the sub-structures being shifted upward in a parallel operation with the overflow from the top of each sub-structure being stored in the buffer memory location of the sub-structure located immediately above followed by a transfer of the contents of the buffer memory location into the lowest memory location of the substructure to which the buffer memory location is attached.

In the example just described in relation to FIG. 1 it is assumed that the size (ie. data carrying capacity) of each of the memory locations and of the buffer memory locations is the same. Also, this example specifically shows what amount to 26 sub-structures each containing four memory locations (and one buffer memory location of the same size as any one of the individual memory locations.

Figure 7:
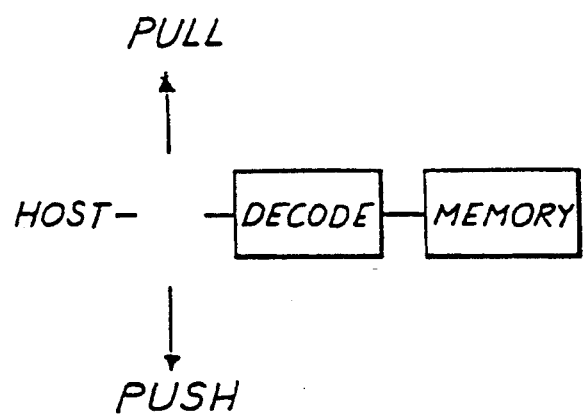
FIG. 7 shows an alternative embodiment of memory content movement by the front push-pull method.
Figure 8:
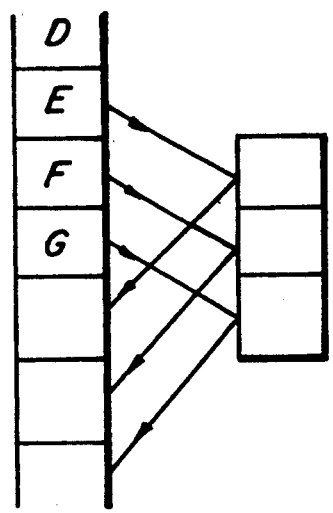
FIG. 8 shows a particular form of front push-pull termed segment push-pull.

In a further example applied to FIG. 1, the sub-structures 2, 3, 4, 5 together with their associated buffer memory locations 6, 7, 8, 9 are transposed so as best to be thought of as lying side by side as adjacent columns. (This example is later described applied to a content addressable memory embodiment termed "segment push-pull" as illustrated in FIGS. 7 & 8.) In this second example shuffling of memory contents takes place in a slightly different way with greater use being made of the buffer memory locations 6, 7, 8, 9 during any given shuffle operation. In this example the "ordering" of the memory contents is from left to right with the top "row" containing memory locations A1, B1, C1, ... Z1 and the next "row" containing memory locations A2, B2, C2, ... Z2 and so on. To shuffle the memory contents, the contents of location A3 are moved into buffer memory location 6. At the same time, and in parallel, the contents of memory location B3 are moved into buffer memory location 7, the contents of memory location C3 are moved into buffer memory location 3, and the contents of memory location Z3 are moved into buffer memory location 9. As a second step or operation, the contents of the buffer memory locations 6, 7, 8, 9 are transferred to the immediately adjacent column (sub-structure) except for the contents of buffer memory location 9 which "wraps around", and is placed in, the left most sub-structure in the second row. In summary, buffer memory location 6 transfers to memory location B3, buffer memory location 7 transfers to memory location C3, buffer memory location 8 transfers to memory location D3, and, at the end column, buffer memory location 9 transfers to memory location A4 in sub-structure 2. This results in a generally left to right raster scan type shuffle. As with the first example the rate at which a complete shuffle is carried out is essentially determined by the depth of the sub-structures. However, the arrangement of this second example allows more efficient use of the "parallelism" of the sub-structures and will typically provide a faster shuffle for a given amount of data than the first example, particularly where not all of the sub-structures are filled with data.

Variations on this basic structure are possible and include (but are by no means necessarily limited to) the following:

The number of memory locations in each sub-structure as a proportion of the total number of memory locations in the memory structure is arbitrary and depends upon design constraints. As the number of memory locations in each sub-structure increases as a proportion of the total number of memory locations in the memory structure, the execution speed of the first step of a shuffle operation is reduced.

The buffer memory location can be varied in size or, indeed, in structure. For example the buffer memory location can comprise two memory locations stacked one upon the other thereby allowing two memory locations in a sub-structure to "overflow" into the buffer memory location.

The structure described in FIG. 1 is particularly useful for speeding up sorting operations when records are stored in the memory structure 1 of FIG. 1 in order by key. As an essential part of any ordering operation it is necessary to make room in the memory structure at arbitrary memory locations so as to insert new records or delete records therefrom. Generally speaking, the nature of the memory structure of FIG. 1 is such that the shuffle operation necessary to make room for the new record depends for its speed of execution only upon the number of memory locations in each sub-structure, not on the total number of memory locations of the whole memory structure. Accordingly very large memory structures containing a large number of memory locations can be shuffled as quickly as a memory structure containing only the number of memory locations to be found in any one of the sub-structures making up the whole memory structure. This particular feature or attribute is utilized in the following description of further preferred embodiments of the invention.

2. CONTENT ADDRESSABLE MEMORY EMBODIMENTS

Unlike other hardware CAMs which combine search logic with memory cells to form one piece of active memory, the embodiments of content addressable memory to be described hereunder decouple the logic from memory, making the memory much easier to fabricate and allow much more flexibility in the design of the logic circuits. The content addressable memory of the embodiments is hereinafter termed a push-pull content addressable memory (PPCAM).

One special characteristic of the PPCAM is its use of parallel techniques in maintaining the data structure for fast searching, thus dramatically reducing the search hardware required.

PPCAM operates on data directly in memory rather than moving it through the memory hierarchy (eg. from main memory to cache, from cache to register). This non-register based architecture is justifiable only due to the recent advances in memory technology which enable memory speeds to approach speeds of central processing units (CPUs), thus reducing the penalty in direct memory operations.

As software cost continues to increase and hardware cost decreases, hardware based solutions like the PPCAM become more attractive. For example, recent advances in very large scale integration (VLSI) technology allow the PPCAM to be implemented much more cheaply than before.

2.1 PUSH-PULL CONTENT ADDRESSABLE MEMORY (PPCAM)

The PPCAM is based on simple sequential operations and at first glance seems very inefficient. The use of parallel techniques enables the PPCAM to overcome this traditional problem.

Unlike most other hardware CAMs, the PPCAM is based on the sorted-list, and achieves its performance with a low logic per bit ratio by using dedicated hardware, in addition to search hardware, to maintain the data in sorted order.

2.1.1 PPCAM ARCHITECTURE

While the PPCAM can support a number of high level operations the basic operations are INSERT, FIND and DELETE. For the FIND operation, the PPCAM performs a search algorithm (for example a binary search) to locate the required record (FIG. 1) or records.

Figure 3:
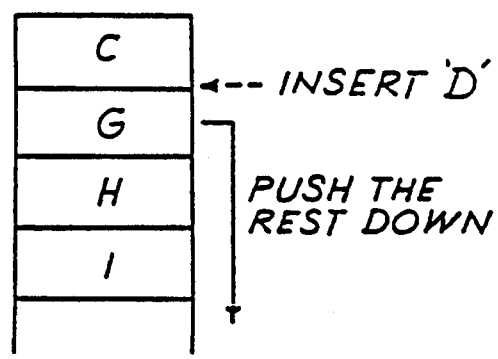
FIG. 3 shows diagrammatically an "INSERT" operation on a list.
Figure 4:
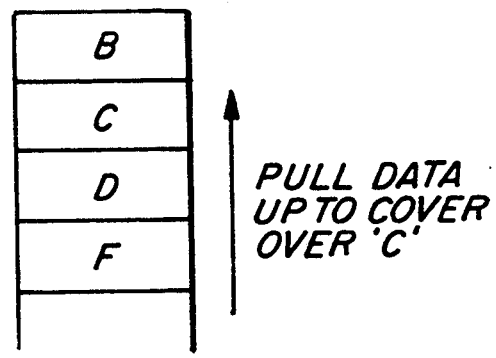
FIG. 4 shows a "DELETE" operation from a list.

To INSERT, the PPCAM looks for an address in which to insert the record using the FIND operation and then pushes every record following that address down, creating room to insert the new record (FIG. 3). Similarly, to DELETE, the PPCAM covers the record to be discarded with the one below it and pulls all the following records up (FIG. 4).

In the FIND operation, the PPCAM only scans a small part of the data, unlike most other CAMs, which scan all data. This allows PPCAM to have one of the fastest search times of all existing CAMs. Recent hardware CAMs have a search speed of about 1000 Mbits per second, a software CAM on a 12 MHz IBM AT (Registered Trade Mark) type personal computer (PC) can do about 5 Mbits per second (see Computerworld Australia, 25 Aug. 1989). A 16 bit word size PPCAM using the same type of RAM as the PC can do, more than 100 Gbits per second. ie. 1,000 times faster than the currently available hardware CAMs and 20,000 times faster than the software tree solution.

Ultra fast search speed such as in the above example comes with a price, namely, the data has to be in sorted order. The INSERT and DELETE operations are used to keep the data in the PPCAM in sorted order. The pushing and pulling of data items in the INSERT and DELETE operations are typically inefficient. In the present embodiment parallel techniques are used to speed them up in the PPCAM.

Figure 5:
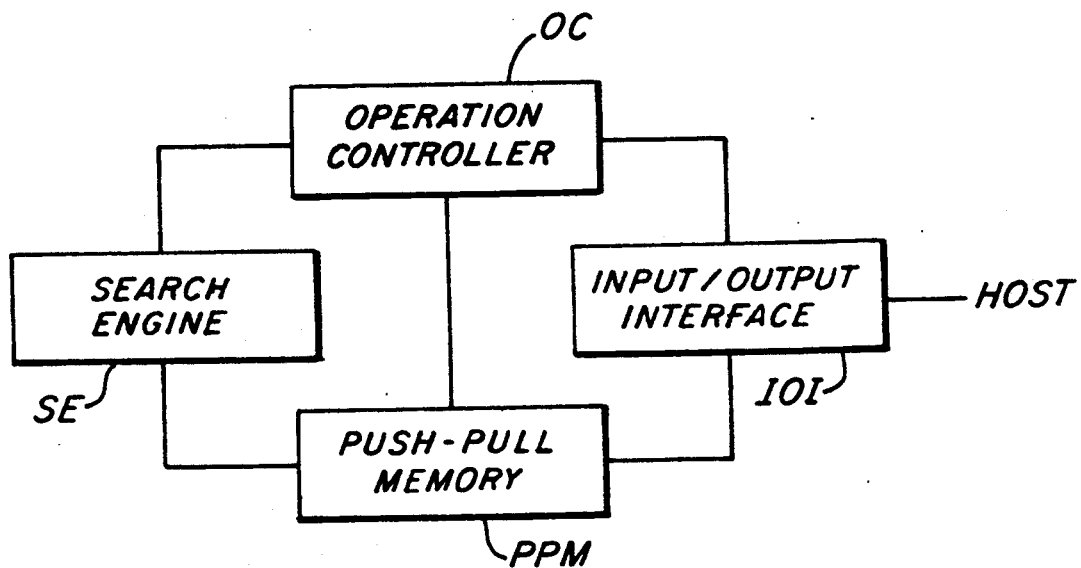
FIG. 5 shows a block diagram of a first embodiment of the invention as a CAM structure.

By its nature the PPCAM provides a method of facilitating sorting and thereby implementation of content addressable memory in a computer. The design consists of a search engine (SE), an operation controller (OC), an input/output interface (IOI) and a push-pull memory (PPM) as shown in FIG. 5.

The four components of the PPCAM mentioned are functional rather than physical. Each can be implemented using software or hardware, depending on specific applications and performance required. The four (conceptual) components are now described.

2.1.2 OPERATION CONTROLLER (OC)

The OC controls the other modules of the PPCAM and prevents internal bus contentions. By reading requests from the host and checking the state of the PPCAM, it activates different modules within the PPCAM to execute the required operations.

Due to the simplicity of the operations of the PPCAM, the OC can be implemented with a few simple logic chips if basic INSERT, DELETE and FIND operations are all that is required, thereby avoiding the fetching storing, decoding and executing of instructions that occur in most other co-processors.

However, the OC can also be implemented as software executing on a host or a microprocessor dedicated to the PPCAM operations so as to provide more high level functions.

2.1.3 INPUT/OUTPUT INTERFACE (IOI)

The IOI is mainly used to perform conversion between the PPCAM word size and host word size. In situations where the PPCAM word size is the same as the host memory word size, the PPCAM can simply be mapped directly onto the host address space in which case the IOI will not usually be required.

Another function of the IOI is in high performance systems where there are separate data paths to the host and to the mass storage. In this case, the IOI has its own storage interface to reduce the load of the PPCAM on the host data bus. The host and the mass storage can then access different parts of the PPM concurrently.

The PPCAM data structure is sorted and linear. Also it is directly accessible by the CPU. Seamless interface to existing computer systems is possible through the use of memory mapping and function calls. Recent popularity of procedural techniques in programming makes interface to the PPCAM much easier. The PPCAM operations can directly replace search and sort function calls.

Depending on its actual function, the IOI can vary from a few logic gates to a few lines of code to provide interface to the CPU or DMA controllers.

2.1.4 THE SEARCH ENGINE (SE)

The SE is used to perform the look-up operation. It has an address calculator controlled by a comparator. The comparator indicates whether the magnitude of the data under test is greater, smaller or equal to the target data (depending on the actual search algorithm, a 2-way instead of 3-way comparator may be used).

The address calculator may use the binary search technique in general situations, but if the distribution of data is known then a different search technique can be used to produce results faster (eg. dividing by three instead of two).

For the binary search technique, the search engine can be built with simple logic components like adders, shifters and comparators. More sophisticated parallel-pipelined search processors can be used if higher performance is needed, for example the Fibonacci search (see T. Feng, "Parallel Processing", Proceedings of the Segamore Computer Conference, Aug. 20–23, Springer Verlag 1975).

A Masking Register can be incorporated into the SE. It is then possible to search and sort on specific subfields within a word. By setting bits in the Masking Register, the comparator can operate on different parts of the data as required. This is useful for example in situations where an alternate search key is needed in the same set of data.

Depending on the performance required, the SE can be execute in software on the host or a dedicated microprocessor or custom built hardware. In the case of using a microprocessor, an external comparator is needed to avoid the overhead of moving PPM words into the microprocessor's registers for comparisons. An 8-bit processor can then be used to search a 64-bit wide PPM efficiently, as long as the comparator is 64-bit wide.

2.1.5 THE PUSH-PULL MEMORY (PPM)

The aim of the push-pull memory is to maintain the memory data in sorted order, via the push-pull technique, independent of the host. Each push-pull consists of a sequence of operations to shift data up and down the memory area. A Push or Pull will be performed depending on whether there is an INSERT or DELETE operation.

Figure 6:
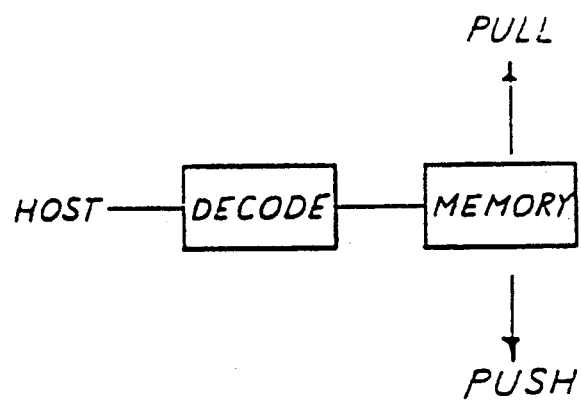
FIG. 6 shows one embodiment of memory content movement by the back push-pull method.

There are two ways of accomplishing the push-pull operation. The push-pull operation can be performed directly on memory cells after the address decoding circuit (FIG. 6) (Back Push-Pull), or the push-pull operation can be performed using the decoding circuit (FIG. 7) (Front Push-Pull).

The Back, Push-Pull is more suitable for VLSI implementation using charged coupled device (CCD), shift registers etc, while the Front Push-Pull matches the random access memory (RAM) chips that are readily available, and could also be implemented in VLSI using standard macro-cells. The present application concentrates on the Front Push-Pull type PPM but the invention should not be construed as limited thereto.

The word size of the PPM is mainly dependent on the application. For dedicated applications, the PPM will have the same word size as the data item (record) being manipulated. For more general applications the word size will normally be the same as the host word size.

In high-performance systems, the PPM word size will be a multiple of the host word size. For example, if the host has a 32-bit word size, then the PPM will have a 64-bit or 128-bit word size. This allows much faster push-pull and searching. The increase in word size is not expensive, since unlike the word size of the CPU, the associated logic increase is very small. Also, recent improvements in integrated circuit (IC) packaging technology (eg. reduced pin size in surface mount components), has made wide memory words more feasible as the number of pins required increases.

2.1.5A PUSH-PULL CONTROL BITS

Functionality of the PPCAM could be improved by adding a few control bits at the end of the PPM words. For example, the push-pull operation could be interrupted orderly and ambiguous addressing would be possible.

Although the FIND operation is very fast it could be held up by push-pulls initiated by past INSERT or DELETE operations. One way to solve this problem is to allow interruption of the push-pull operation. The nature of the push-pulls allows FIND access to be performed while the push-pull is going on. This is because the list remains in order during the push-pulls.

During the push-pull operation, duplicated records are constantly being created and destroyed. When the push-pull operation is interrupted, it is necessary to leave the data in a consistent manner. This can be done by having a few control bits added to the end of each word. This concept, called Push-Pull Control Bits, can be used to disable, identify, and re-order words temporary.

For example, consider the delete bit is at the end of each record, in which the bit is set to O normally, and set to 1 when a record is deleted. The two duplicate records will be next to each other, and if the delete bit of the "lower" record is set (the one with larger physical address) to 1, then its value will be larger than the record "above" it, and the FIND operation can then be performed properly. After the FIND operation is finished, the push-pull operation can be continued.

The Push-Pull Control Bits concept is also useful in other situations, like in resolving multiple favourable responses (ambiguous addressing), an extra bit could be added to the end of the records, when set to 1, indicate that they are not unique. This provides a powerful way of handling records with the same content.

2.1.5B PPM WORD SIZE

The word size of the PPM is mainly dependent on the application. For dedicated applications, the PPM will have the same word size as the data item (record) being manipulated. For more general applications, the word size will normally be the same as the host word size.

In high-performance systems, the PPM word size will be a multiple of the host word size. For example, if the host has a 32-bit word size, then the PPM will have a 64-bit or 128-bit word size. This allows much faster push-pull and searching. The increase in word size is not expensive, since unlike the word size of the CPU, the associated logic increase is very small.

The PPCAM can handle data items of different sizes very easily, both early at the hardware design stage, or latter when in use.

The PPCAM's memory modules could be horizontally cascaded together with no increase in complexity. This allows the hardware designer to tailor the PPM word size for specific applications.

At the usage stage, the data items can span or share PPM words. By using the Masking Bits a few data items could be manipulated within one PPM word. If the data items are too large, they can span across a few PPM words. This situation can be handled by inserting an address off-set when calculating addresses during searching and process one word at a time.

5.1.6 PARALLEL PUSH-PULL

The main feature that differentiates PPCAM from other techniques is the use of parallel hardware to manipulate data in conventional RAM. This not only attains fast speed, but also low cost and high integration.

There are two ways of increasing the push-pull speed by breaking the memory up into separate banks. The aim is to move a few records at the same time by providing additional buffer, and data paths.

With the parallel push-pull operation, the more banks being used, the faster the push-pull operation. The speed up is linear. As long as there are a sufficient number of memory banks, the total time it takes to push-pull any amount of data will be the same as the time it takes to push-pull the data in just one bank of memory. The push-pull time will be constant and independent of the amount of data.

In the first way, termed the Segment Push-Pull, a whole segment of memory words is moved down in one operation (FIG. 8). While FIG. 8 shows a push of three words down, a push-pull distance of any number of words is possible. In order to facilitate such an operation, a number of consecutive sorted data items could be stored in separate banks (FIG. 8).

Since the memory words are interleaved, for each push-pull, words may have to be transferred across the banks. The banks will have their own buffers to store the words in transit, going from one bank to another. These buffers are called Transfer Buffers.

Figure 10:
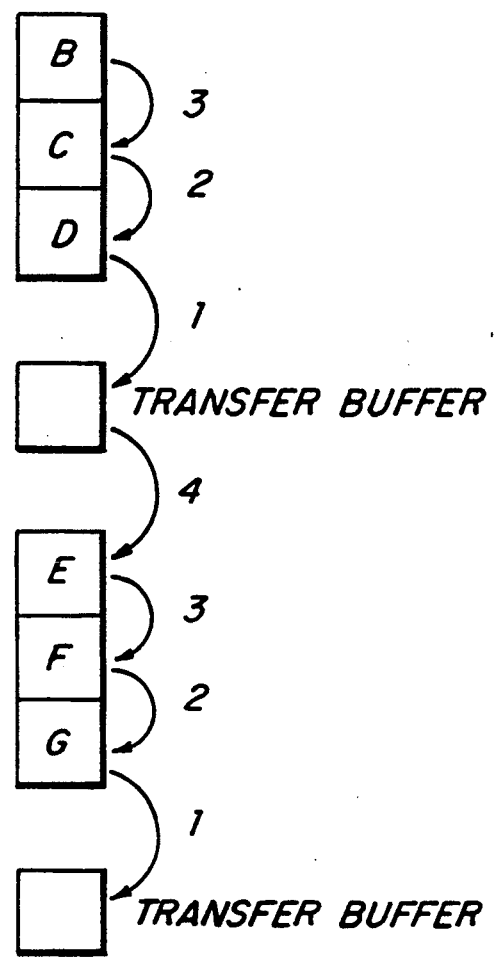
FIG. 10 shows an alternative form of front push-pull known as split push-pull.
Figure 11:
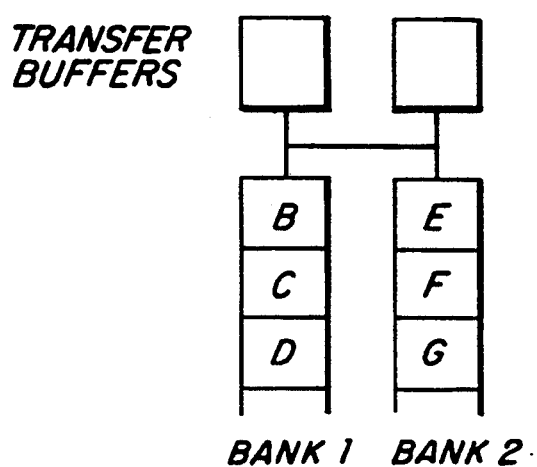
FIG. 11 shows data items arranged in storage for the split push-pull method of FIG. 10.

In the second way, termed the Split Push-Pull, a group of evenly spaced words is moved all at once (FIG. 10). Unlike the earlier method, the words are transferred between banks ONLY at the end of the push-pull operation. Here consecutive sorted data items are stored in the same bank until the bank is full (FIG. 11).

One major difference between the Split and Segment push-pulls is in the manner in which data items are moved and stored in the memory banks. The Split Push-Pull moves data physically across the memory banks while the Segment Push-Pull moves data physically up and down the banks. Data in Split Push-Pull is stored in sorted order across banks while the sorted data is stored down the banks in Split Push-Pull.

Both push-pulls are more efficient than other forms of parallel processing. Since the data is simply moved around there is no degradation in performance due to multiple access and data integrity control. Also the regular structure of the PPM allows it to be implemented in VLSI very easily.

2.1.7 LARGE PUSH-PULL

With the Parallel Push-Pull method there is a performance problem when each data item spans a few PPM words since each push-pull only moves each of the PPM words by one position.

For every INSERT and DELETE, it takes as many push-pull operations as the number of words in a data item to move the whole item. If an item is five words in size, it will take five times as long to perform an INSERT or DELETE as a data item with a size of one word. This is because with each push-pull only one word can be transferred across the memory banks and a five word size item requires five push-pull operations.

If the size of the Transfer Buffer is increased to at least the size of the data item, a whole data item can be push-pulled across the banks with one push-pull operation. The INSERT and DELETE time will then be independent of the size of the data item (as long as the data item is smaller than the size of one memory bank).

This concept is named the Large Push-Pull. Data of different sizes can be moved with one push-pull, as long as the total size of the data to be moved is not greater than the size of a bank. The large Push-Pull is effectively increasing the push-pull distance of the push-pull operation, since each push-pull is not restricted to moving data by one word only.

While the Large Push-Pull can push-pull more data, depending on how it is implemented, in most cases it is not possible to push-pull further than the next bank. The Large Push-Pull does increase the amount of memory required slightly. This is acceptable in many situations as memory is cheap and the improvement in speed of push-pull for large data items is from $O(N^2)$ to $O(N)$ and thereby quite significant.

2.1.8 JUSTIFICATION FOR PUSH-PULL MEMORY

While the Parallel push-pull schemes allow linear improvement in push-pull speed, it still seems inefficient to move so many records every time there is an INSERT or DELETE operation. One way to increase the speed is to decrease the number of words in each bank. In the limiting case there is only one word in each bank, thus all the words can be moved in just one memory access.

Such high push-pull speed is NOT necessary in most cases. In almost every application the host has some other processes to perform before and after accessing the CAM. An example of such a process is looking up a file from the disk after accessing the index, or sending some information on to the network after modifying a station status. Thus if the incoming data is buffered the push-pull operation can be overlapped with other host operations. This is another form of parallelism which allows the PPCAM to perform some useful work while the host is doing something else. The off-line data structure organization time is used as a leverage against the on-line search time.

The PPCAM's INSERT and DELETE commands can be executed in two phases: the search phase and the push-pull phase. The first phase (search phase), using the FIND operation, is very fast. It finds out where to start performing the push-pull and makes sure that the CPU is not INSERTing the same data or DELETING non-existent data. Control is then returned to the CPU and the second phase (push-pull phase) occurs concurrently as the CPU continues its execution. Thus to the CPU the INSERT and DELETE speeds look as quick as the FIND speed.

With the parallel push-pull techniques, the worst case scenario (the insertions and deletions are always at the beginning of the PPM banks) will be the same as the average case (random access patterns). The total push-pull time will always be the same as the time needed to push-pull just one bank.

In some applications, the insertions and deletions are always performed at the end of the list (eg. invoice numbers, dates etc.). There are no push-pull operations in these cases. Furthermore, in most applications, read and change operations far outnumber the insert and delete operations. The fast FIND and slow INSERT, DELETE nature of the PPCAM matches these applications perfectly.

As shall be seen in a later section, when very high INSERT and DELETE speeds are required, a Fast Push-Pull scheme can be used to increase the throughput of these operations.

2.1.9 POSSIBLE IMPROVEMENTS

Instead of pushing and pulling in one direction, such steps can be performed in both directions, choosing the direction that needs fewer push-pull operations. This will decrease the push-pull time when one or two banks of memory are being used. If more than two banks are cascaded together to perform parallel push-pull, the push-pull time will always be equal to the time needed to push-pull a full bank. This feature is probably not worth implementing if there are more than two banks, because of the extra logic required.

Since all banks can be isolated from each other, it is tempting to add a SE to each bank so that the searches can be done in parallel. This is not required in most situations as the speed saving will only be O(log N) for the inclusion of the additional hardware.

If the PPCAM is microprocessor based then higher level functions can be added easily. For example, adding virtual memory functionality is possible by functionally manipulating the IOI unit; the PPCAMs can be used to implement top levels of a B-tree data structure (known per se in the art) that is partially stored on disk. In this manner the CAM can be up to giga-bytes in size.

2.1.10 IMPLEMENTATION ISSUES

There are many different ways of implementing PPCAM, from using VLSI to Video RAM. New concepts like the PPCAM require new designs to realise it effectively. A sample implementation of a Split Push-Pull PPCAM is given in the next section.

It is not optimal, but as a prototype it demonstrates PPCAM's main features.

2.2 PPCAM PROTOTYPE (SPLIT PUSH-PULL)

Figure 9:
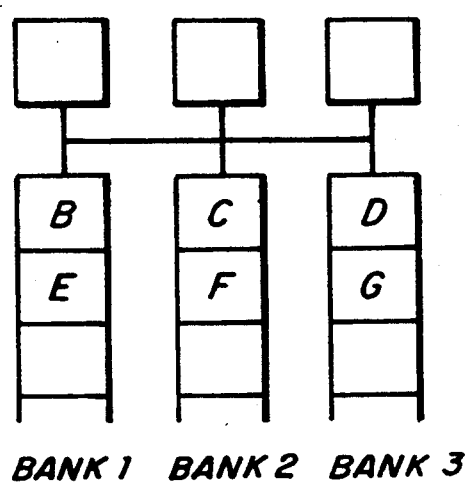
FIG. 9 shows data items arranged for implementation of segment push-pull of FIG. 8.

The first hardware prototype description, with reference to FIG. 11, implements the split push-pull approach of FIGS. 9 & 10.

Figure 12:
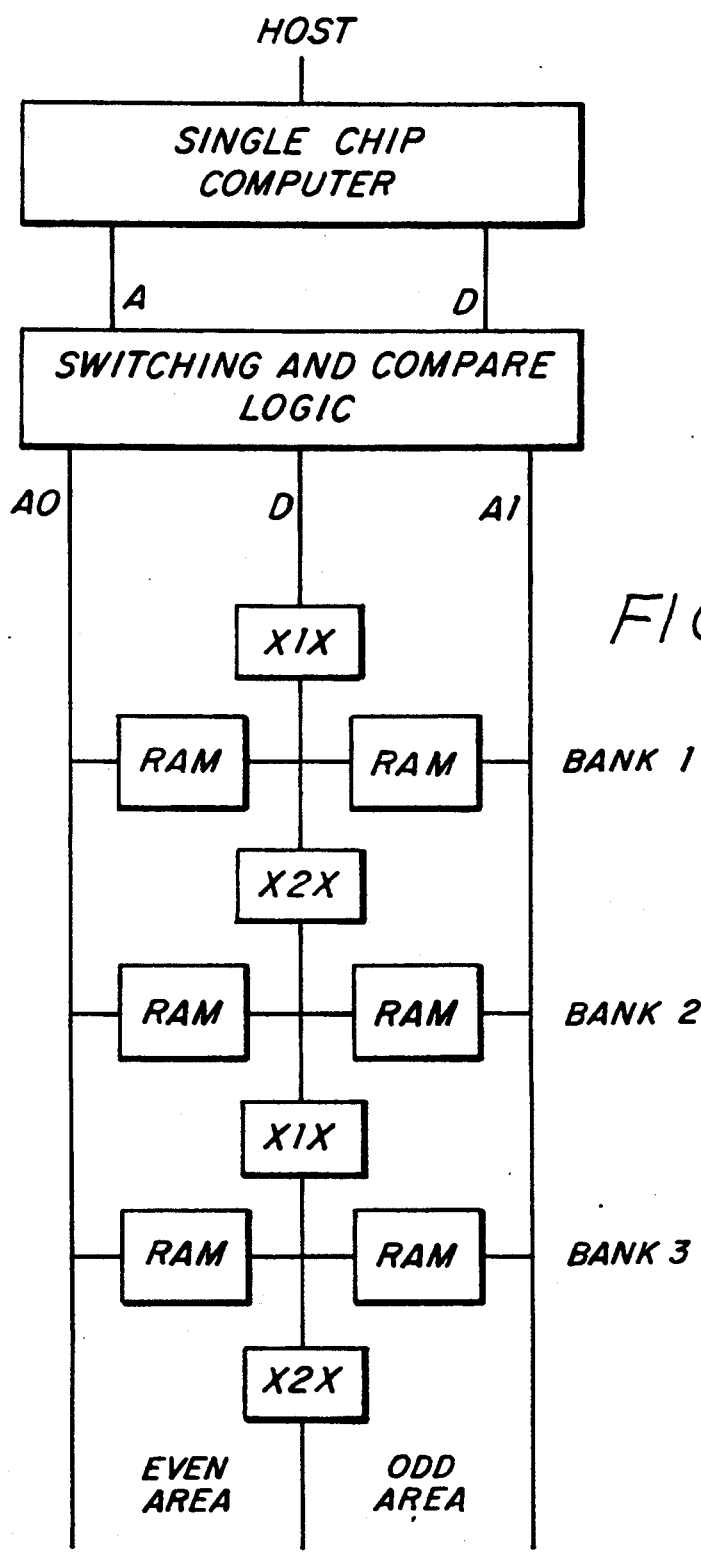
FIG. 12 shows a hardware implementation of a CAM embodiment of the invention utilizing commercially available RAM chips.

The OC, SE, IOI and the controller part of the PPM are all implemented with a single chip microcomputer and some support logic (FIG. 12).

The support logic provides an external comparator for the SE and switches the address and data buses between the host, the microcomputer and the memory banks. In the prototype high speed counters are used to drive the odd and even address buses.

Note that the data paths are implemented on a single data bus with switches dividing each bank. There are two sets of switches, with every second switch belonging to the same set. By turning the switches on or off, it is possible to isolate or link specific banks with their neighbours, or with the microcomputer. In high performance systems, a second data bus might be required to provide the microcomputer with direct access to the memory banks, by-passing the switches to prevent undesirable propagation delay.

Each PPM memory bank contains two equal size RAM areas linked by a common data bus. One area is used to store even address data, the other area is used to store odd address data. The logic circuit, between the computer and the RAM banks, makes the two areas appear as one continuous piece of memory to the host and SE. In fact, the areas are interleaved. This can be achieved simply by using the least significant bit (LSB) of the incoming address to select the correct area and passing the remaining bits to the selected memory area.

In this prototype, a part of each RAM area is reserved for the Transfer Buffer of the memory bank they belong to. The Transfer Buffers are used to hold temporary data during the push-pull operations. Another way is to incorporate the Transfer Buffers in the switches between the banks, rather than taking up space in the RAM areas.

The microcomputer performs a push-pull operation by sending the appropriate signals to the memory banks.

For example, the following table shows the required signals in a push (down) operation involving memory areas with a capacity of four records each (the bank can store eight records):

TABLE 1

SAMPLE SIGNAL TABLE

| STEPS | EVEN AREA (A0) | | ODD AREA (A1) | |
|---|---|---|---|---|
| | Addr | R/W | Addr | R/W |
| 1 | down | W | 11 | R |
| 2 | 11 | R | 11 | W |
| 3 | 11 | W | 10 | R |
| 4 | 10 | R | 10 | W |
| 5 | 10 | W | 01 | R |
| 6 | 01 | R | 01 | W |
| 7 | 01 | W | 00 | R |
| a | 00 | R | 00 | W |
| 9 | 00 | W | up | R |

TABLE 1—SAMPLE SIGNAL TABLE

The addresses are in binary (from 00 to 11), the address down is the address of the
Transfer Buffer of this memory bank and the address up is the address of the
Transfer Buffer of the memory bank above this one.

The push-pull operation normally goes through the following stages:

[Stages 1 and 2 correspond to Steps 1 to 8 of the table in TABLE 1 and stages 3 to 5 correspond to Step 9.]

1 The memory banks are first isolated from each other by turning all the switches off.
2 Signals similar to those listed out in the table above are then applied to all the memory banks at the same time thus facilitating data transfer within each bank between the two (odd and even) memory areas.
3 One set of switches (i.e. every second switch) is then turned on to allow communications between pairs of banks. Data from the Transfer Buffer of one bank is then written into the storage area of the other bank.
4 That set of switches is then turned off and the other set of switches is turned on. This allows the banks to be linked with the corresponding other neighbouring bank.
5 Data is then copied from a Transfer Buffer of one bank to the other bank.

The technique used above is called Overlap Switching and it allows the time of inter-bank data transfer to become constant (independent of the number of banks).

By putting Transfer Buffers in the switches rather than in the RAM areas, stages 3 to 5 listed above could be replaced by a single stage:

data from the Transfer Buffers is copied into a Data Area of the next bank.

This specific design relies on low-cost RAM and advanced single chip micro-computers. The price/performance ratio of these two components has improved substantially in the past few years (eg. single chip computers having high clock speed large internal RAM and many peripheral ports only cost $13 (Australian) at the time this specification was drafted).

The overall aim of this prototype is to move all the relatively complex less frequent operations into software and leave the repetitive, simple operations to hardware. This makes a very versatile PPCAM as it is only then necessary to change the software to adjust characteristics of the PPCAM.

The total cost will be low since no special hardware is required. All the parts are available in large quantities as off-the-shelf components. The bus structure is simple and the PPCAM can be integrated easily with existing architecture through memory mapping.

This prototype by itself should compete quite strongly with existing hardware and software CAMs. It still relies on some software for its operation but the real power of the PPCAM comes from its simple design causing this pure hardware implementation to be very cost-effective. In mass production, the PPCAM and the single chip computer and its associated software can easily be replaced with hardware logic using either custom or off-the-shelf ICs. This further lowers PPCAM s cost and increases its speed.

2.2.1 PUSH-PULL DISABLE

The push-pull stages presented above only apply to parts of the PPM. When the INSERTs and DELETEs are being performed at the middle of the sorted list it is necessary to disable the push-pull for the data "above" the point of insertion or deletion.

The address where the insertion or deletion is required is termed the Update Address. During a parallel push-pull, three types of memory banks appear:

Type 1: The bank containing the Update Address (where the insertion and deletion is going to occur). Part of the data in the bank is required to be push-pulled.

Type 2: The banks "above" (those with addresses larger than) the Type 1 bank. No push-pull on data is required.

Type 3: The banks "below" (those with addresses smaller than) the Type 1 bank. Full push-pull of all data within the banks is required.

For Type 3 banks, it is necessary to apply signals similar to the ones given in the signal table above to the banks in order to perform a full push-pull of all the data in the bank.

Since the push-pull addresses are going to appear on the dual address buses, a simple decode circuit or ROM can be used to disable the Type 2 banks by using the first few bits of the Update Address.

For the Type 1 bank, the bank is either enabled (for push down operation), or disabled (for pull up operation), at the start of the push-pull. When the push-pull reaches the Update Address, the bank is then disabled (for push down operation), or enabled (for pull up operation). This will ensure that the push-pull operation will only affect the relevant part of the bank.

In order to facilitate the partial push-pull of data within the Type 1 bank a counter can be used to keep track of when to disable or enable the bank.

2.3 PPCAM PROTOTYPE (SEGMENT PUSH-PULL)

The prototype given is designed for Split Push-Pull. For Segment Push-Pull, it is necessary to provide a connection between the last bank and the first bank since data is moving across the bank with each push-pull in most cases.

Using the previous circuit (FIG. 12) the data path is looped back from the bottom to the top and a switch is placed between the two banks. Conceptually, such an arrangement is similar to a circular ring of banks with data being transferred from one bank to the other.

If the Transfer Buffers are incorporated in the switches, then the inter-bank transfer becomes very fast since all the transfers occur in parallel.

Overlap Switching can also be used in this case. Although the transfer speed will be slightly slower, it doesn't require the buffers to be incorporated into the switches.

2.4 DYNAMIC RAMs AND MULTIPLE ADDRESS RANGES

The use of dynamic RAM in the PPM is not a penalty as the nature of the PPCAM forces most of the RAM to be accessed each time there is an INSERT or DELETE operation. The memory banks above the delete and insertion can be refreshed concurrently while the RAM below the operation is being pushed or pulled. Since all banks share the same address lines, it is necessary only to disable the writes for those banks.

When there are only FIND operations, all the RAM has to be refreshed explicitly. This is still acceptable because, since all the banks can be isolated and share the same address lines, the refresh procedure can be performed in parallel.

Figure 13:
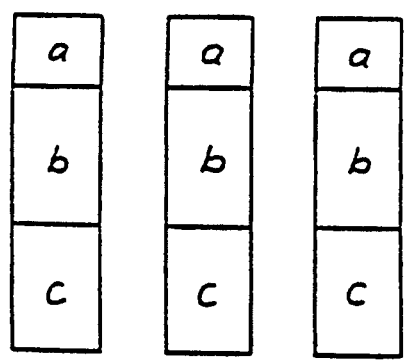
FIG. 13 shows the multiple address range (MAR) method of division of chips or memory banks.

Current dynamic RAMs are getting larger in word depth but not in word size. The PPCAM on the other hand requires wide words and short RAM depth for fast operation (the wider the word size the more data can be moved with each push-pull and the shorter the RAM depth the less data there is to push-pull per bank). A solution is to use Multiple Address Ranges (MAR), which assigns different ranges of addresses within a RAM chip (or a bank) to different applications (FIG. 13).

This is similar to many small logical memory banks within each big physical memory bank, each small memory bank being used by a different application. Rather than using up the whole memory bank or chip, each application uses a fixed address range in the bank. When that address range is used up in one bank, the same address range in the next bank will be used.

Allowing different applications to share the same RAM chip (or bank) can not only save memory space but also allows dynamic adjustment of the depth of the memory banks for different applications.

Since the speed of the PPM is inversely proportional to the depth of the memory banks, this will enable tuning of the performance of the PPCAM for individual applications. In FIG. 13, the address range used by application 'a' is smaller than the range used by application 'b', thus application 'a' will have better memory performances than 'b'.

All that is needed is a table that lists application identifiers and their corresponding address ranges in RAM. This table can itself be stored in the same RAM chip (or bank). The push-pulls and searches simply use this table to limit their range. MAR can easily be implemented in the PPCAM prototype using software.

Another feature of MAR is that, since the PPCAM can be addressed by location if there is not enough content-addressable data to use up all the RAM in the PPM, the remaining RAM ranges can be used to store normal data. No RAM is wasted as the PPM can be used as part of the host's normal memory.

2.5 PARALLEL GLOBAL OPERATIONS

In some applications, different parts of the application data need to be operated upon with the same operator. Since the PPCAM allows multiple banks to be addressed simultaneously (as long as the data is properly aligned within each bank), multiple locations can be read or written at the same time. This allows fast bulk manipulation of data items.

Note that the same data can be stored in a lot of different locations simultaneously with each write. For example, if all the words in the PPM need to be reset to 0, and there are 1000 words, it will only take the same time as resetting 100 words if we have 10 banks in the PPM, since the banks get reset at the same time.

Data can also be scanned in bulk at a fast rate. In this case the bus has to be modified so multiple signals can be put on the same bus at the same time (e.g. by the use of open collector drivers). One use will be in the case where we want to select a record out of the PPM by the low or 'O' value of a few bits within the record. If there are 10 banks in the PPM, then all 10 banks can be accessed together and the specific bits on the bus can be monitored. When the scanned bits match the required values, then the required record is in one of the 10 records accessed.

By adding some AND and OR circuits to the banks and using the transfer buffers we can perform high level operations on parts of the PPM words in parallel. The PPCAM becomes a simple single instruction multiple data (SIMD) machine that can perform a lot of different data operations (eg. scanning data strings), thereby offloading even more work from the CPU.

2.6 FAST PUSH-PULL

The major weakness of the PPCAM is its relatively slow INSERT and DELETE speed compared to the FIND operations. When data updates happen at very high speed, the PPCAM might not have enough time to perform push-pull operations. The following methods can be used to handle sudden bursts of INSERT and DELETE operations.

For INSERT, the data can be sorted initially in a special buffer, and then subsequently perform the pushes afterwards. In some applications, data might come in and then be followed immediately by a large number of FIND operations. In such cases both the PPM and the buffer have to be searched. The sequential scan through the buffer will degrade FIND performance.

A solution is to use MAR and assign a second address range for the incoming data. However unlike the main address range for that application, the second range is much shorter in depth (e.g. 16 words deep rather than 1000 words deep). The data can be accepted much faster and the searches will only be slightly slower since there will be less data to push-pull but both the second address range and the first address range have to be searched.

Since the searches are quite fast (the data is sorted) and applications tend to use more recent data, if the smaller range is searched first every time, the FIND response might actually improve as it is more likely to find the right data in the smaller range. This is in effect a cache for the application data using the same PPM. The smaller range is caching the larger range.

If the load on the PPCAM decreases, then the data can be merged from the smaller range back to the bigger range using perhaps the Large Push-Pull operation.

For the DELETE operation, the incoming requests will not be buffered. The FIND operation is used to locate the data item to be deleted and then a data invalid bit in the item will be set or a 'deleted' code will be written into the item. The pull operations can be delayed until the PPCAM work load reduces. The Parallel Global Operations feature can be used to scan for all the deleted items and to actually delete them (permanently) using the pull operation afterwards.

2.7 POTENTIAL APPLICATIONS

The PPCAM can be used in specialized applications like multiple access control and maintenance of frequently used objects (eg. track and sector lists for disk driver or active process lists in real time operating systems), where the data item size is fixed and the frequency of access is high.

An example is virtual memory translation. The PPCAM can be used in existing computer systems with a simple re-write of the virtual memory handling routines. The computer manufacturer can not only increase the speed of the machine's memory system (independent of applications), but also provide added functionality.

The PPCAM can take a huge load off the operating system allowing the CPU to spend much more time running applications instead of doing process and storage lists management (for example, see H M Dietel, "An Introduction to Operating Systems", Addison—Wesley, 1984). A detailed example on how this could be achieved is given in the next section.

The computer industry is pushing for standards in communications, applications, databases, user-interfaces etc. The PPCAM can provide much faster data conversion between different systems and emulation of other systems. The local value and its corresponding foreign value can form a record and be stored in the PPCAM using one of them as the key, depending on the direction of the conversion or emulation.

Another area is in communications networks. The PPCAM can be used for encoding and decoding data and also maintenance of network parameters like station address and status. Furthermore, the conversion and emulation abilities of the PPCAM will speed up operations in network gateways or communications servers.

More generally, the PPCAM can be used to provide hardware assist to different applications, for example in the database management area. Each PPCAM can store one data table and queries of databases can be executed much more quickly. Even operations like FIND MAX, MIN, NOT etc can be done in the same amount of time as a normal FIND operation. Partial match, in range test, next record, last record, select, project, join type operations, and integrity controls can also be implemented easily. When more complex operations are required, the PPCAM can be used as a building block for more complex data structures.

One side-effect of the PPCAM is that if disordered records are input into the PPCAM, and then read out again in sequence, they will be in sorted order. Thus PPCAM can also be used as a hardware sorter.

The PPCAM is moving away from typical CAM applications, like memory address mapping, to more high level roles. As more power is added to the OC and SE, the PPCAM can be used as a full function data co-processor. PPCAM's high flexibility and fundamental nature allows it to be used in virtually all situations with large improvement over current techniques.

2.8 DISK CACHE CONTROLLER

One application of the PPCAM is in the implementation of a disk cache controller. Caching or buffering is mainly performed by the operating systems in most computers. A lot of time is spent on maintaining the cache and implementation of disk-access scheduling algorithms.

A solution to this problem is to use a separate processor (which is the approach used in most high-performance systems). However, there is a dilemma here in choosing the right type of processor, which is needed to perform very basic operations on large data chunks.

The location of sectors (sector address) in disk units normally requires at least 4 or 5 bytes to represent the drive number, head number, track number and sector number. Such sizes make the job of maintaining those numbers very difficult for 8 or 16-bit processors. The use of 32-bit processors is an over-kill as a lot of their functions are wasted.

Using the PPCAM will result in a very fast disk-cache controller with low cost. Not only can data be cached at a much finer level, but sophisticated disk scheduling algorithms can be implemented to minimize head seek times.

A sector address list can be stored in the PPCAM as a list of records to indicate the sectors that are currently in the cache. The PPM word size will be the same as the record size. Sorted automatically by the sector address, the list arranges the physically close sectors together on the list.

Two extra bits can be added to the record so that the 'Not-Used-Recently' replacement scheme can be used to flush data out to disk. The two bits, called Referenced Bit and Modified Bit, are reset to O for a new sector in the cache. They are set to 1 according to whether the sector has been referenced or modified. As time goes on four types of sectors will evolve, according to the bits values:

Type 1—Unreferenced, Unmodified
Type 2—Unreferenced, Modified
Type 3—Referenced, Unmodified
Type 4—Referenced, Modified.

When the cache is full and an old sector needs to be replaced by the new sector it is best to replace type 1 first then type 2, type 3, and type 4 last. Note that type 2 seems illogical but it is actually the result of the periodic resetting of the Referenced Bit. The reason for the periodic resetting of all Referenced Bits is to maintain the ability to distinguish the most desirable sectors to replace as under heavy usage most Referenced Bits will be set after a while. The resetting of the Referenced Bits can be performed in parallel using the Global Operation feature of the PPCAM described earlier. Besides ease of maintenance, better performance tracking and high access speed the sorted sector list has two additional desirable effects in the flush operations.

2.8.1 FORCED FLUSH

When the host fetches a new sector that is not in cache, the sector has to be read from the disk. Assuming that the cache is full then one of the Sectors in the cache has to be replaced.

Using the SE to locate the position for the new sector in the sector list enables a search to be performed from that location to find a sector of the right type to be replaced. If the sector to be replaced has been modified then the sector has to be written out.

The average seek time is reduced since sectors nearer to the disk head will be tested first in order of replacement. The push-pull time is also reduced as only push-pulling of the records between the new and old sectors in the sector list is needed.

2.8.2 VOLUNTARY FLUSH

When the host is not requesting service from the PPCAM, the PPCAM can go through the sector list in order, and write out any sector that has been modified. By writing out the modified sector and resetting the Modified Bits in this way, the number of seeks the disk head has to perform is reduced as the head only moves continuously in one direction until all writes are finished.

Note that the resetting of both the Referenced and Modified Bits is done in the background so the host data bus will be free for some other tasks. This disk-cache management scheme could also be adopted to be used in virtual memory management systems.

2.9 SUMMARY OF ADVANTAGES OF CAM PREFERRED EMBODIMENTS

While the PPCAM of the preferred embodiments can replace most hardware CAMs, the other major aim is to use PPCAM to replace existing software CAMs. Its flexibility and tunability allow it to be used in general applications, from simple table look-up to inferences in artificial intelligence, thus not only improving the price-performance characteristic of existing applications, but also allowing applications previously not cost-effective to be implemented. The Front Split Push-Pull is emphasized in this specification, but by mixing and matching with other different push-pulls (Back and Segment) and implementation techniques (Large Push-Pull, MAR, Fast Push-Pull Overlap Switching, Push-Pull Control Bits), it is possible to tailor the PPCAM for almost any application.

The PPCAM of the preferred embodiments provides a powerful means of manipulation of non-numerical data objects. The PPCAM addresses some of the most fundamental areas in computing. For the first time, CAM is available at costs that are virtually the same as location addressable conventional memory. The PPCAM is an advance because of its approach to manipulation of data. It distinguishes itself from most other techniques in the following ways:

(1) Efficient parallel operation: unlike most other techniques the parallel performance of the PPCAM does not degrade as the number of data items increases. The push-pull performance stays linear, while the search performance is actually better than linear.

(2) Wide data path: the PPCAM s simple design allows increase in memory word size, to improve performance, with little corresponding increase in logic (or cost). Most CAMs, whether software or hardware, degrade in performance very quickly as the data item sloe increases. By having a wide data path the PPCAM is much less sensitive to this degradation.

(3) Avoidance of memory hierarchy overhead: the PPCAM operates on memory directly. There is no need to move data from memory to cache to register or vice versa.

(4) Seamless interface to current architecture: the PPCAM maps directly into the computer's normal main memory and can be addressed normally using data item location or by the contents of the location. Also, the data is sorted and linear, and thus can be manipulated by the computer easily.

(5) Overlapping of instruction execution: the slower PPCAM operations, like INSERT and DELETE, can be overlapped with normal host processing; thus hiding their slowness.

(6) Off-loading of the most time consuming operations in computing: by off-loading searching, sorting and other bulk data operations; very large gains in application execution can be achieved.

(7) Flexible performance tunning: PPCAM's dynamic tunability allows it to be used in a lot of different applications. The decoupling of logic from memory cells also allows new functionality to be added much more easily.

(8) Handles variable data lengths: PPCAM's memory modules could be horizontally cascaded together with no increase in complexity and its memory words could be combined to store larger items. This makes manipulation of variable length data very simple.

(9) Multiple responses resolution: Since the data is sorted, records with the same contents are stored next to each other, multiple matches (responses to FIND) could be handled readily.

(10) Based on conventional technology: The PPCAM can be built with off-the-shelf components or existing VLSI techniques using conventional RAM cells. Due to the lower manufacturing cost of these devices, large capacity PPCAM could be realized cheaply. This large capacity is not just useful in handling large data items, but also in improving the speed of operation, since the loading and re-loading of data for different applications is reduced.

(11) Multiple Addressing Modes: With sorted data, powerful queries could be made on the data with little overhead. Besides addressing using exact match and by location; partial match, greater than, less than, not equal, maximum, minimum etc could also be used to address the data.

Some of the benefits provided by the PPCAM includes:

(1) On the software side, the PPCAM's ability to replace most current software data structures will result in:
faster program execution
smaller program size
easier performance tuning
lower software complexity
quicker application development
reduced software maintenance costs
more portable software.

(2) On the hardware side the PPCAM shifts a lot of work from the CPU to active memory. This results in:
reduced hardware complexity
more efficient use of memory
higher functionality
simpler implementation
easier integration.

I claim:

1. A memory structure for storing records, said structure comprising a plurality of contiguous memory locations each for storing one of said records, said plurality of memory locations being divided into memory sub-structures, each of said memory sub-structures comprising a separate but contiguous sub-portion of said memory structure, each of said sub-structures including a buffer memory location attached thereto, each of said buffer memory locations being arranged to receive a record stored in a memory location within the corresponding sub-structure and to transfer a record stored in that buffer memory location to a memory location within the corresponding sub-structure, wherein each of said buffer memory locations is further arranged to;
receive a record stored in one of said memory locations of an immediately adjacent one of said sub-structures; and to
transfer a record stored in that buffer memory location to one of said memory locations of an immediately adjacent one of said sub-structures.

2. The memory structure of claim 1, wherein each of said records includes a search key comprising at least a part of each record and said records are stored in search key order.

3. The memory structure of claim 1, wherein each of said sub-structures includes an equal number of memory locations.

4. The memory structure of claim 1, wherein each of said buffer memory locations is the same size as each one of said memory locations.

5. The memory structure of claim 1, wherein each buffer memory location has the capacity to hold more than one record held in said memory locations.

6. The memory structure of claim 1, wherein said memory structure performs as a stack, and whereby a record is added to the stack at a chosen one of said memory locations within said memory structure by shuffling all records at and above said chosen memory location up one memory location (UP SHUFFLE OPERATION).

7. The memory structure of claim 1, wherein said records in said memory structure are maintained in sorted order.

8. The memory structure of claim 1 further comprising an overlap switching configuration for allowing data to be transferred between said sub-structures concurrently through a two-stage process, said overlap switching configuration comprising switches between each sub-structure, said switches being divided into two sets in which every second switch belongs to the same set, said data transfer being effected by turning said sets on and off so as to link and respectively isolate each sub-structure with neighboring ones of said sub-structures thereby allowing concurrent data transfer between sub-structures.

9. The memory structure of claim 1 further comprising control bits appended to the record in each occupied memory location, said control bits being maskable and allowing marking of specific ones of said records for use by different applications including identifying identical search keys of different records.

10. The memory structure of claim 1, wherein the memory structure performs as a stack, and whereby a record is added to the stack at a chosen memory location within said structure by shuffling all records at and below said chosen memory location down one memory location (DOWN SHUFFLE OPERATION) in the memory structure.

11. The memory structure of claim 1, wherein the memory structure performs as a stack, and whereby a record is added to the stack at a chosen memory location within said structure by shuffling all records sideways in raster format when said sub-structures are transposed.

12. The memory structure of claim 1, wherein the memory structure performs as a stack, and whereby a record is deleted from said stack by a logically opposite overwrite process.

13. A method of storing records in a memory structure having a plurality of contiguous memory locations, each for storing one of said records, said plurality of memory locations being divided into memory sub-structures, each of said memory sub-structures comprising a separate but contiguous sub-portion of said memory structure, each of said sub-structures including a buffer memory location attached thereto, each of said buffer memory locations being arranged to receive a record stored in a memory location within the corresponding sub-structure and to transfer a record stored in that buffer memory location to a memory location within the corresponding sub-structure, wherein each of said buffer memory locations is further arranged to;

receive a record stored in one of said memory locations of an immediately adjacent one of said sub-structures; and to transfer a record stored in that buffer memory location to one of said memory locations of an immediately adjacent one of said sub-structures;

said method comprising the steps of storing said records in said memory structure in search key order, and placing said records into contiguous memory locations in said structure ordered by search key.

14. The method of claim 13, wherein the memory structure performs as a stack, and whereby a record is deleted from said stack by a logically opposite overwrite process.

15. The method of claim 13, wherein said memory structure performs as a stack, and said method further comprises the step of adding a record to the stack at a chosen one of said memory location within said memory structure by shuffling all records at and above said chosen one of said memory locations up one memory location (UP SHUFFLE OPERATION).

16. The method of claim 15 wherein an UP SHUFFLE OPERATION is performed by dividing said stack into smaller sub-stacks as follows:
  A. all memory locations in the sub-structure containing said chosen one of said memory locations above said chosen one of said memory locations are treated as a sub-stack,
  B. all sub-structures above the sub-structure containing said chosen one of said memory locations are treated as sub-stacks,
  C. a record is popped off the top of each of the stacks and is respectively stored in the buffer memory location attached to the sub-structure immediately above the sub-structure from which that record has been popped,
  D. all of the sub-stacks are pushed up by one memory location,
  E. to complete the UP SHUFFLE OPERATION, each record now stored in each buffer memory location as a result of the UP SHUFFLE OPERATION so far is transferred to the bottom memory location in the sub-structure to which that buffer memory location is attached, and
  F. at the same time as or subsequent to step E, the record to be added to said stack is transferred into said chosen one of said memory locations.

17. The method of claim 15 wherein said method further comprises the step of overwriting a chosen location by shifting the records of all memory locations below that chosen memory location up one location.

18. The method of claim 13, wherein the memory structure performs as a stack, and said method further comprises the step of adding a record to the stack at a chosen one of said memory locations within said memory structure by shuffling all records at and below said chosen one of said memory locations down one memory location (DOWN SHUFFLE OPERATION) in the memory structure.

19. The method of claim 18 wherein a DOWN SHUFFLE OPERATION is performed by dividing said stack into smaller sub-stacks as follows:
  A. all memory locations in the sub-structure containing said chosen one of said memory locations below said chosen one of said memory locations are treated as a sub-stack,
  B. all sub-structures below the sub-structure containing said chosen one of said memory locations are treated as sub-stacks,
  C. a record is pushed off the bottom of each of the sub-stacks and is respectively stored in the buffer memory location attached to the sub-structure immediately below the sub-structure from which that record has fallen,
  D. all of the sub-stacks are pushed down by one memory location,
  E. to complete the DOWN SHUFFLE OPERATION, each record now stored in each buffer memory location as a result of the DOWN SHUFFLE OPERATION so far is transferred to the top memory location in the sub-structure to which that buffer memory location is attached, and
  F. at the same time as or subsequent to step E, the record to be added to said stack is transferred into said chosen one of said memory locations.

20. The method of claim 18 wherein said method further comprises the step of overwriting a chosen memory location by shifting the records of all memory locations above that chosen memory location down one location.

21. The method of claim 13, wherein the memory structure performs as a stack, and said method further comprises the step of adding a record to the stack at a chosen memory location within said structure by shuffling all records sideways in raster format when said sub-structures are transposed.

22. The method of claim 21, wherein a raster type shuffle is performed as follows:
  A. all sub-structures are in a side by side format,
  B. for all memory locations below said chosen one of said memory locations at which an insertion is desired,
  C. each record in the lowermost row of memory locations in all sub-structures is shifted into the corresponding buffer memory location,
  D. each record in each buffer memory location is shifted into the memory location of the adjacent sub-structure corresponding to the memory location from which that record has just been removed,
  E. steps C and D are repeated for the next row up of memory locations in all sub-structures until the record in said chosen one of said memory locations is moved, and
  F. the record to be added to the stack is inserted in said chosen one of said memory locations.

23. The method of claim 21, wherein a raster type shuffle is performed as follows:
  A. all sub-structures are in a side by side format,
  B. for all memory locations above said chosen one of said memory locations at which an insertion is desired,
  C. each record in the uppermost row of memory locations in all sub-structures is shifted into the corresponding buffer memory location,
  D. each record in each buffer memory location is shifted into the memory location of the adjacent sub-structure corresponding to the memory location from which that record has just been removed,
  E. steps C and D are repeated for the next row down of memory locations in all sub-structures until the record in said chosen one of said memory locations is moved, and
  F. the record to be added to the stack is inserted in said chosen one of said memory locations.

* * * * *